United States Patent
De Oliveira

(10) Patent No.: US 7,135,119 B2
(45) Date of Patent: Nov. 14, 2006

(54) METHOD FOR MAKING A MULTILAYER MODULE WITH HIGH-DENSITY PRINTED CIRCUITS

(75) Inventor: Rui De Oliveira, Arenthon (FR)

(73) Assignee: Organisation Europeenne pour la Recherche Nucleaire (CH)

(*) Notice: Subject to any disclaimer, the term of this patent is extended or adjusted under 35 U.S.C. 154(b) by 364 days.

(21) Appl. No.: 10/499,365

(22) PCT Filed: Dec. 12, 2002

(86) PCT No.: PCT/FR02/04305

§ 371 (c)(1),
(2), (4) Date: Jun. 18, 2004

(87) PCT Pub. No.: WO03/055288

PCT Pub. Date: Jul. 3, 2003

(65) Prior Publication Data

US 2005/0011856 A1    Jan. 20, 2005

(30) Foreign Application Priority Data

Dec. 20, 2001  (FR) .................. 01 16522

(51) Int. Cl.
*H01B 13/00*    (2006.01)
(52) U.S. Cl. ........................ 216/18
(58) Field of Classification Search ............ 216/18; 29/825, 829, 846, 852, 830, 831
See application file for complete search history.

(56) References Cited

U.S. PATENT DOCUMENTS 4,639,290 A    1/1987  Leyden et al.
5,436,062 A    7/1995  Schmidt et al.
6,016,598 A    1/2000  Middelman et al.

FOREIGN PATENT DOCUMENTS

GB    1134632    11/1968

OTHER PUBLICATIONS

Patent Abstracts of Japan, vol. 018, No. 107 (C-1169), Feb. 22, 1994 & JP 05 301981 A (Sumitomo Metal Mining Co Ltd), Nov. 16, 1993, abstract.
Patent Abstracts of Japan, vol. 017, No. 313 (E-1381), Jun. 15, 1993 & JP 05 029768 A (Hitachi Cable Ltd), Feb. 5, 1993, abstract.
Patent Abstracts of Japan, vol. 006, No. 143 (C-117), Aug. 3, 1982 & JP 57 065727 A (Hitachi Chem. Co. Ltd; Others: 01) Apr. 21, 1982, abstract.

*Primary Examiner*—Parviz Hassanzadeh
*Assistant Examiner*—Roberts Culbert
(74) *Attorney, Agent, or Firm*—Stites & Harbison PLLC; Marvin Petry

(57) ABSTRACT

The invention concerns a method for making a multilayer module with high-density printed circuits, which consists in: preparing a substrate (1) with double-sided printed circuits (3) whereon is bonded a single-sided plated (7) polyimide (6) additional layer using a polymerisable two-phase epoxy liquid (8); after selectively etching (9) the metal, carrying out anisotropic chemical drilling of micro-holes (12) through the polyimide film (6) by immersing the latter in a static bath of a potassium-added aqueous ethylene-diamine solution at least at 25° C.; rinsing the adhesive (8) by spraying a solvent in the base of the micro-holes (12); plating the micro-holes (12); and selectively etching the outer metallic film (7, 13) to form therein printed circuits (14) including the plated micro-holes (15).

8 Claims, 3 Drawing Sheets

METHOD FOR MAKING A MULTILAYER MODULE WITH HIGH-DENSITY PRINTED CIRCUITS

FIELD OF THE INVENTION

The present invention relates to improvements in the fabrication of high-density printed-circuit multilayer modules.

DESCRIPTION OF THE PRIOR ART

It is known to fabricate high-density printed-circuit modules, for example modules of the SBU (Sequential Built-Up) or HDI (High Density Interconnected) or even of the MCML (Multichip Module Laminated) type, by bonding, on either side of a substrate having printed circuits on both sides, additional layers formed from a film, especially made of polyimide, which is metallized on one face, each layer being provided with metallized holes for establishing through-connections between its own printed conducting tracks and those of the substrate or of a subjacent film.

The fabrication of such modules has difficulties.

It is known to chemically drill holes in a polyimide film (see for example document EP-A-0 832 918).

However, the processes known at the present time result in isotropic etching of the polyimide so that it is very difficult for the shape and diameter of the holes to be perfectly controlled, and in particular it is difficult to chemically drill very-small-diameter holes (or microholes) needed for a high density of circuits and of through-connections.

Electronic techniques at the present time require ever increasing degrees of miniaturization, and therefore ever increasing circuit densities. To achieve this, it is necessary to be able to juxtapose interconnection microholes as close together as possible, and therefore to allow their transverse dimensions to be precisely controlled.

The chemical etching techniques available at the present time are not satisfactory as regards this point from the standpoint of practical requirement, and the etching of microholes is currently carried out using physical (plasma, laser or photo-image) techniques which, admittedly, provide the desired precision but which, however, require the use of very sophisticated and very expensive equipment, with an initial installation investment that is very high.

One drawback of the laser technique stems from the fact that the microholes are drilled individually, one after another. This results in a considerably increased fabrication time.

The additional layer is bonded to the substrate using sheets of solid adhesive which, after they are cut to the required shape, are applied to the non-metallized side of the polyimide film, the whole assembly then being positioned on the substrate before being subjected to a treatment under temperature, pressure and time conditions suitable for curing the adhesive. The sheets of adhesive available commercially and used for this purpose possess, however, substantial thicknesses (for example typically around at least 0.05 mm).

Under these conditions, the film of adhesive appearing at the bottom of the microholes etched through the polyimide film could admittedly be removed by means of a suitable solvent. However, the known solvents for the adhesives used have an isotropic action, so that the removal of the adhesive takes place over a diameter that is all the larger the longer the solvent will have acted for drilling the substantial thickness of the adhesive film. With this process it is not possible to ensure that the hole etched into the adhesive layer will have exactly the same shape and the same transverse dimensions as the hole drilled through the polyimide film.

SUMMARY OF THE INVENTION

The invention aims to remedy the aforementioned drawbacks of the known techniques and to propose an improved process that allows high-density printed-circuit multilayer modules to be fabricated having a quality and characteristics that are identical to those fabricated using physical (laser, plasma or photo-image) techniques, but with a very much lower investment in equipment, and therefore with a unit manufacturing cost of the modules that is considerably reduced and also with the possibility of fabrication on a continuous manufacturing line.

For these purposes, what is proposed is a process for fabricating high-density printed-circuit multilayer modules, said process, established in accordance with the invention, being characterized in that it comprises the following steps of:

preparing a substrate with printed circuits on both sides and with metallized through-holes, this substrate being prepared by using conventional printed-circuit fabrication techniques;

intimately bonding, on one side of the abovementioned substrate, by means of a curable two-stage liquid epoxy adhesive, an additional layer formed from a polyimide resin film, one face of which is coated with a metal coating, said layer being bonded via the non-metallized face of the resin film;

selectively etching said metal coating of the additional layer in order to remove the metal at predetermined locations intended for the microholes facing subjacent metallized regions of the substrate;

anisotropic chemical drilling of the through-microholes through said film by immersing said film in a static bath of an aqueous ethylenediamine solution to which potassium hydroxide has been added in an amount proportional to the thickness of the polyimide resin film and to the transverse dimension of the microholes, at a temperature of at least 25° C., and then by rinsing with a detergent;

removing the adhesive layer appearing at the bottom of the microholes passing through the film by spraying a solvent thereon so that the microholes emerge at the subjacent metallized regions of the substrate;

metallizing said microholes so that their metallization is in conducting contact with the abovementioned subjacent metallized regions and with the external metal coating of said layer; and selectively etching said metal coating in order to form printed circuits thereon which are in conducting contact with said metallized microholes.

Preferably, the microholes are etched through the polyimide resin film using an aqueous solution of one third water and two thirds ethylenediamine per liter, to which potassium hydroxide KOH has been added. In this case, for one liter of aqueous solution, the potassium hydroxide is present in an amount of about 64 g in order to drill microholes with a diameter of about 50 µm in a polyimide resin film having a thickness of about 50 µm.

Advantageously, the fastening of the additional layer by bonding comprises the following steps of:

coating the non-metallized face of the polyimide resin film using a two-stage liquid epoxy adhesive as a layer of uniform thickness as such and curing the adhesive in such a way that the uniform layer of cured adhesive has a thickness approximately equal to at least the thickness of the printed circuits that are present on the receiving face to which the film has to be bonded; and vacuum-pressing the layer onto the receiving face under temperature, pressure and time conditions suitable for ensuring uniform bonding of the layer.

In one practical method of implementation, the additional layer comprises a polyimide resin film covered on one face with a copper film having a thickness of at least 5 µm so that it has sufficient strength to prevent it debonding along the edges of the microholes owing to the effect of the swelling of the subjacent polyimide in contact with the aqueous etching solution.

To form high-density printed-circuit modules, two additional layers with a metallized external face may be intimately fastened to the two respective sides of the initially prepared substrate, or else several films may be stacked one on top of the other, treating them in succession.

Depending on the intended provisions in accordance with the invention, the film or successive films are treated by a conventional chemical etching technique, including that for drilling the microholes under conditions allowing the microholes to be given small dimensions (typically of around 50 µm) and the precise shape that are required. However, the use of a chemical technique requires only an initial financial investment in terms of equipment that is considerably less than that needed for the equipment based on advanced technologies (plasma, laser, photo-image) employed hitherto for the same purposes. In addition, the use of a chemical technique allows continuous fabrication on the production line to be established, instead of step-by-step fabrication as required by the prior use of physical technologies.

In other words, the process of the invention can be used to fabricate high-density printed-circuit modules at lower cost and more rapidly or more uniformly, whilst still obtaining modules with the same characteristics.

It should be pointed out here that, within the context of the present invention, the expression "anisotropically drilled holes or microholes" is understood to mean holes whose transverse dimensions are perfectly well controlled over their entire depth, these transverse dimensions decreasing in a controlled manner from the surface of the film. In other words, the aim is to produce holes that are not strictly cylindrical in shape but have a conical shape of controlled conicity (for example with a diameter at the bottom that is approximately half the diameter of the orifice) so that, subsequently, the metallization of said holes can be carried out correctly, with a uniform layer of metal that adheres perfectly to the walls of the holes.

BRIEF DESCRIPTION OF THE DRAWINGS

The invention will be more clearly understood upon reading the detailed description that follows of certain preferred methods of implementing the process of the invention. In this description, reference will be made to the appended drawings in which.

DETAILED DESCRIPTION OF THE INVENTION

Reference will now be made firstly to FIGS. 1A to 1H which illustrate, schematically, the successive main steps in the process of the invention resulting in the production of a simple multilayer module (i.e. one having a single additional layer).

Figure 1A:
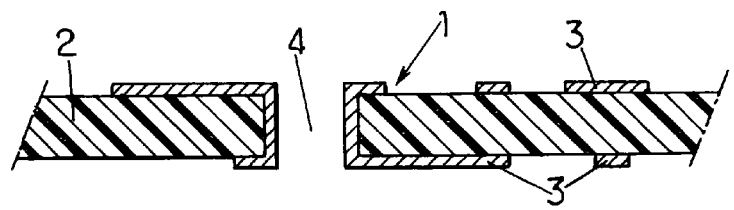
FIGS. 1A to 1H illustrate schematically various successive steps in a preferred implementation of the process of the invention.

Implementation of the improved process of the invention starts with a substrate 1 illustrated in FIG. 1A, consisting of a rigid plate 2 (for example made of an epoxy resin) or a semi-rigid plate 2 (for example made of a polyimide resin) bearing printed circuits 3 (for example made of copper) on both its sides. Conducting connections between printed conductors on the two sides are obtained by means of metallized holes 4 obtained conventionally by mechanical drilling of the plate using a drill, followed by metallization of the holes. The metallization of the holes and the fabrication of the printed circuits on the two sides are carried out by using conventional techniques in this field (especially chemical etching of the printed circuits).

To increase the number of printed conductors, an additional layer, having a core formed from a polyimide resin film coated, on an external face, with a metal coating, generally made of copper, is intimately joined to one side of the pre-prepared substrate.

More precisely, the following procedure may be carried out.

Figure 1B:
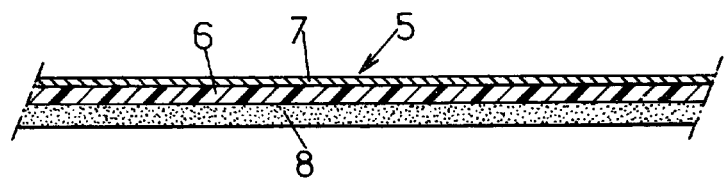

As illustrated in FIG. 1B, an additional layer 5 of flexible type is used, which comprises a core formed from a polyimide resin film 6, such as those commercially available under the names "Kapton" and "Apical"; one side of this film 6 is covered with a metal coating 7, especially made of copper, having a very small thickness which, however, is not less than 5 µm in order to be mechanically strong and to be able to withstand the subsequent treatments without debonding. Such a layer, metallized on one face with no adhesive, is commercially available at the present time (for example metallized polyimide G2300 from Shelldall).

Placed on the non-metallized face of the film 6 is a layer of uniform thickness of a two-stage one-component liquid epoxy adhesive, such as those commercially available under the generic names FR4, G10, G11.

Next, the adhesive is cured, making the thickness of the cured adhesive layer 8 approximately equal to at least the thickness of the printed conductors on the substrate 1 (for example around 15 to 30 µm) so as to ensure that no free space will then remain between the substrate 1 and the polyimide film 6.

Figure 1C:
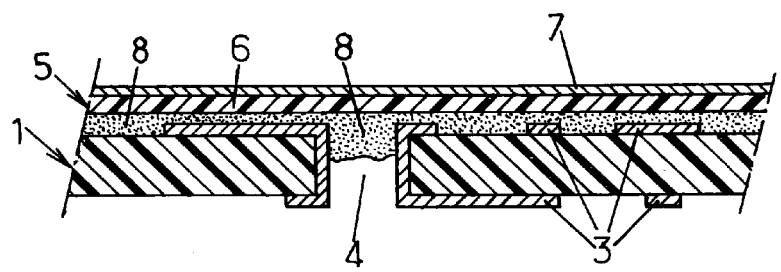

Next, the layer 5 is applied via its face bonded to one side of the substrate 1, by vacuum-pressing it onto the latter. For this purpose, standard equipment for fabricating printed-circuit boards are used, meeting the temperature, pressure and time conditions recommended for the type of adhesive used (in this case the adhesive FR4 for example). A bi-layer assembly as illustrated in FIG. 1C is thus obtained.

Next, through-holes of small diameter (hereafter called microholes) are anisotropically drilled chemically through the additional layer 5 facing predetermined metallized regions of the subjacent side of the substrate. To do this, the procedure may be as follows.

Figure 1D:
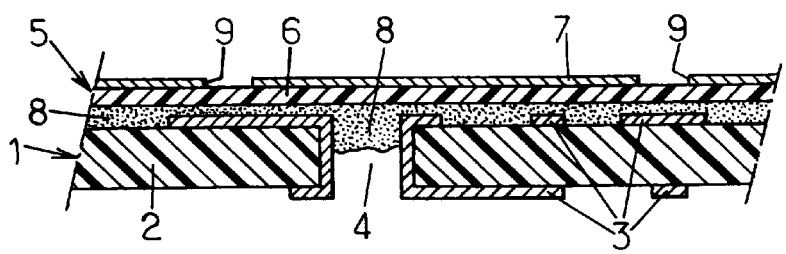

The metal coating 7 on the metallized film 5 is treated using a photolithographic process in order to image the position of the future microhole in the metal coating 7, with removal of the metal (at 9) at said locations, as illustrated in FIG. 1D.

Next, an anisotropic etching operation is carried out, through the open locations 9 in the metal coating 7, through the polyimide film 6 using a static bath of an aqueous ethylenediamine solution to which potassium hydroxide has been added, at a temperature of at least 25° C. The best results are obtained with a solution containing ⅓ water and ⅔ ethylenediamine to which at least 60 g of potassium hydroxide KOH per liter of solution has been added in order to drill holes with a diameter of around 50 µm into a polyimide resin film having a thickness of about 50 µm. It should be noted that the higher the temperature (while still remaining below the boiling point, which is around 110° C. in the case of the composition indicated above) and/or the higher the potassium hydroxide content, the closer the wall of the microholes cut out through the polyimide is to being perpendicular to the face of the film 6.

However, as was explained above, it is undesirable for the microholes to be cylindrical in shape: in order for the subsequent metallization of their walls to be able to be carried but correctly, with good adhesion and good uniformity of the metallization coating, it is desirable for the microholes to be of frustoconical shape with controlled conicity (for example with a bottom diameter/orifice diameter ratio of ½). The formation of microholes having perfectly controlled transverse dimensions and shape is what is meant within the context of the present invention by the term "anisotropic" formation.

During this step, the polyimide resin in contact with the etching solution progressively swells with liquid, so that it locally increases in volume: it is the action of this swelling that entails the risk of localized delamination of the surface metal coating and which requires the use of a coating at least 5 µm in thickness so that it is able, through its mechanical strength, to oppose this lift-off.

Next, a rinsing operation with a suitable detergent is carried out in order to remove the traces of the etching bath and thus to stop the etching. For this purpose, the detergent with the reference NGL 17-40 sold by Lea-Ronal, diluted with water in an amount of 10 g/l, may for example be used.

Figure 1E:
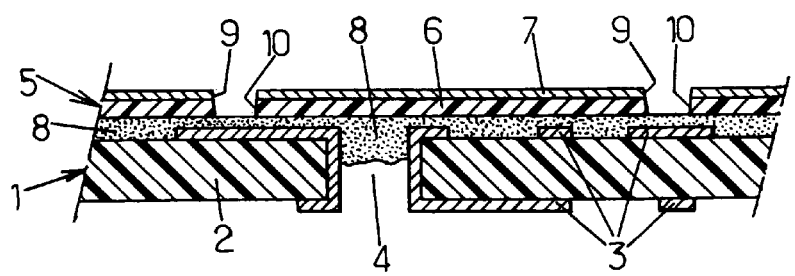

What are then obtained, as illustrated in FIG. 1E, are perforations 10 cut through the polyimide layer 6 and facing, at the bottom, the above-mentioned predetermined metallized regions of the substrate 1.

However, as may be seen in FIG. 1E, adhesive may cover the predetermined metallized regions, which adhesive, being in general electrically non-conducting, must be removed. For this purpose, it is necessary to spray a solvent for the adhesive used into the microholes, the spraying ensuring that the cloud of solvent penetrates right into the bottom of the microholes, despite their small transverse dimension.

In the case of the one-component epoxy adhesive used, such as the adhesive FR4, it may be advantageous to spray sulfuric acid with a concentration of at least 90%, preferably about 96%: this acid spares the copper and the polyimide, but dissolves the adhesive layer in the extension of the direction in which the perforation 10 was etched.

Figure 1F:
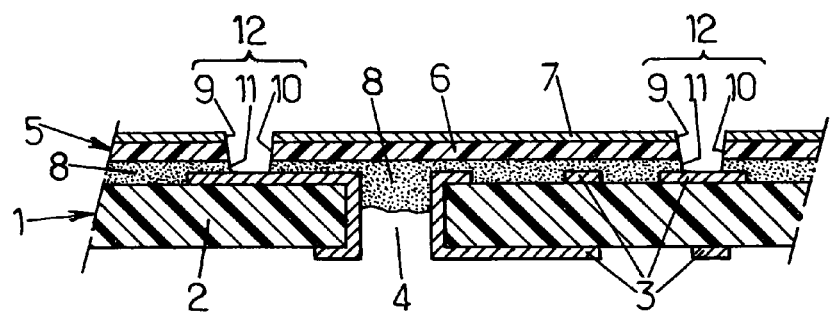
Figure 1G:
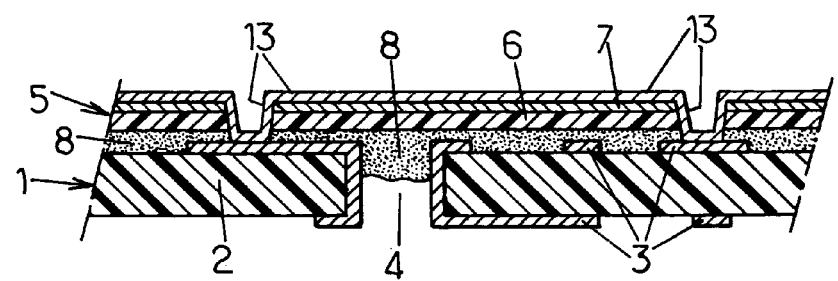

Thus, as shown in FIG. 1F, the assembly formed by the cavity 9 made in the surface metal coating 7, the perforation 10 made chemically in the polyimide film 6 and the cavity 11 formed in the adhesive layer in contact with the subjacent metal conductor of the substrate 1, all located in the extension and with respect to another, defines a small-diameter hole or microhole 12.

The module is completed by metallization of the microholes 12 and of the printed conductors on the external face of the film 5, by carrying out conventional processes in the printed-circuit field. Thus, the microholes 12 may be metallized by the vacuum deposition of a suitable metal (especially copper) so as to form a metal layer 13 in the microholes 12 that is in conductive contact, on the one hand, with the bottom of the microholes formed by the subjacent printed conductor of the substrate 1 and, on the other hand, with the surface coating 7 of the film. In practice, the metal is deposited in the form of a metal layer 13 covering all of the surfaces, as is apparent in FIG. 1G.

Figure 1H:
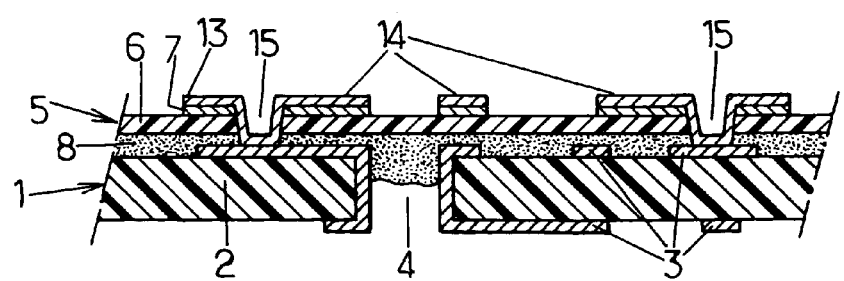

Next, the surface metal layer (formed by the layers 7 and 13 in contact with each other) are selectively etched away so as to constitute the printed tracks 14 on the external face of the film 6, the metallized holes 15 being in conducting contact with said tracks, as may be seen in FIG. 1H.

Figure 2:
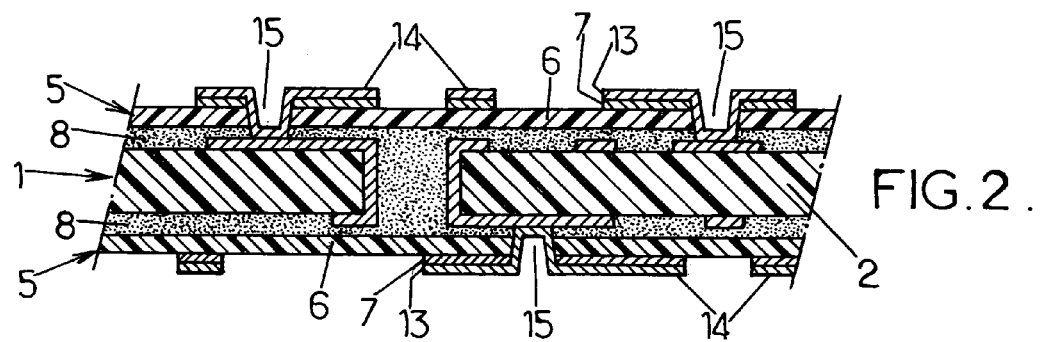
FIGS. 2 and 3 illustrate advantageous embodiments of modules that can be obtained by implementing the process according to the invention.

Preferably, two additional layers 5 are simultaneously bonded to the substrate 1, on the two respective sides of said substrate, and then these two layers are simultaneously treated so as to finally obtain a multilayer module consisting of four printed-circuit assemblies, as illustrated in FIG. 2, it being possible for the metallized microholes 15 to be present on one or both of the external faces of the module.

Figure 3:
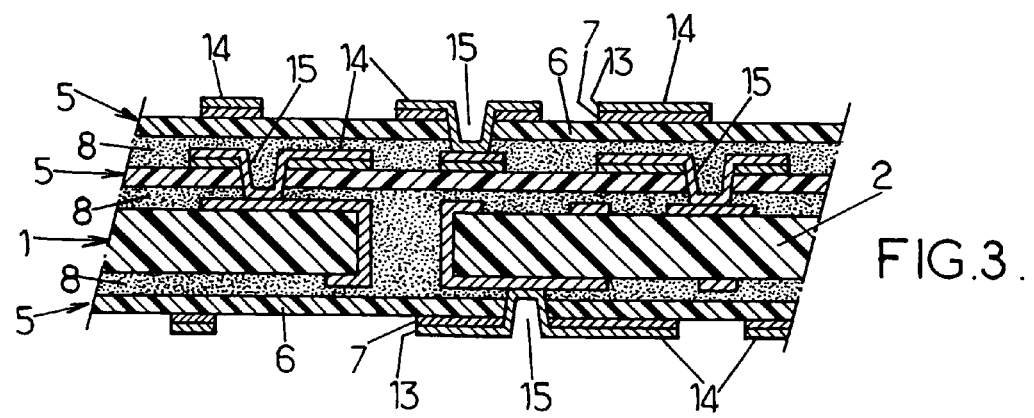

It is also conceivable to superpose several additional layers 5, one on top of the other, as the treatment of the subjacent layer is progressively completed. FIG. 3 illustrates a module constructed around a central substrate 1 with the addition of a lower additional layer 5 and two superposed upper additional layers 5.

Thanks to the process of the invention, it is possible to fabricate high-density printed-circuit multilayer modules by producing metallized microholes of small diameter (for example around 50 µm) by using an anisotropic etching technique carried out chemically on the polyimide. Since the initial investment in terms of equipment is much less than that needed for physical (laser, plasma, photo-image) techniques, the fabrication cost of the modules is appreciably reduced.

This process proves to be compatible with the conventional units for fabricating printed-circuit boards: any manufacturer of conventional printed-circuit boards is thus capable of producing high-density printed-circuit modules, something which hitherto had remained the prerogative of only companies capable of purchasing laser, plasma or photo-image etching equipment.

It should also be noted that the process of the invention is an overall process and that the production time does not depend on the number of metallized microholes present in the module.

Finally, it should also be noted that, by implementing the process of the invention, it is possible to produce metallized microholes of any size, from around 1 micron to around 1 centimeter, and of any cross-sectional shape (round, polygonal, cruciform, etc.).

The invention claimed is:

1. A process for fabricating a high-density printed-circuit multilayer module, characterized in that it comprises the following steps of:
   preparing a substrate with printed circuits on both sides and with metallized through-holes, this substrate being prepared by using conventional printed-circuit fabrication techniques;
   intimately bonding, on one side of the abovementioned substrate, by means of a curable two-stage liquid epoxy adhesive, an additional layer formed from a polyimide resin film, one face of which is coated with a metal coating, said layer being bonded via the non-metallized face of the resin film;
   selectively etching said metal coating of the additional layer in order to remove the metal at predetermined locations intended for the microholes facing subjacent metallized regions of the substrate;

anisotropic chemical drilling of the through-microholes through said film by immersing said film in a static bath of an aqueous ethylenediamine solution to which potassium hydroxide has been added in an amount proportional to the thickness of the polyimide resin film and to the transverse dimension of the microholes, at a temperature of at least 25° C., and then by rinsing with a detergent;

removing the adhesive layer appearing at the bottom of the microholes passing through the film by spraying a solvent thereon so that the microholes emerge at the subjacent metallized regions of the substrate;

metallizing said microholes so that their metallization is in conducting contact with the abovementioned subjacent metallized regions and with the external metal coating of said layer; and selectively etching said metal coating in order to form printed circuits thereon which are in conducting contact with said metallized microholes.

2. The process as claimed in claim 1, characterized in that the microholes are etched through the polyimide resin film using an aqueous solution of one third water and two thirds ethylenediamine per liter, to which potassium hydroxide KOH has been added.

3. The process as claimed in claim 2, characterized in that, for one liter of aqueous solution, the amount of potassium hydroxide present is about 64 g in order to drill microholes with a diameter of about 50 µm in a polyimide resin film with a thickness of about 50 µm.

4. The process as claimed in claim 1, characterized in that the fastening of the additional layer by bonding comprises the following steps of:

coating the non-metallized face of the polyimide resin film using a two-stage liquid epoxy adhesive as a layer of uniform thickness as such and curing the adhesive in such a way that the uniform layer of cured adhesive has a thickness approximately equal to at least the thickness of the printed circuits that are present on the receiving face to which the film has to be bonded; and vacuum-pressing the layer onto the receiving face under temperature, pressure and time conditions suitable for ensuring uniform bonding of the layer.

5. The process as claimed in claim 1, characterized in that the adhesive layer at the bottom of the microholes is removed by spraying sulfuric acid having a concentration of 90 to 100%.

6. The process as claimed in, characterized in that the additional layer comprises a polyimide resin film covered on one side with a copper film having a thickness of at least 5 µm.

7. The process as claimed in claim 1, characterized in that two additional layers with a metallized external face are intimately joined to the respective two sides of the initially prepared substrate.

8. The process as claimed in claim 1, characterized in that at least one other additional layer is also intimately joined to the external face of a layer put into place beforehand and the treatment procedure is repeated on this other layer.

* * * * *